(12) United States Patent
Horikoshi et al.

(10) Patent No.: US 9,818,620 B2
(45) Date of Patent: Nov. 14, 2017

(54) MANUFACTURING METHOD OF SEMICONDUCTOR DEVICE

(71) Applicant: Renesas Electronics Corporation, Koutou-ku, Tokyo (JP)

(72) Inventors: Kotaro Horikoshi, Ibaraki (JP); Toshikazu Hanawa, Ibaraki (JP); Masatoshi Akaishi, Ibaraki (JP); Yuji Kikuchi, Ibarki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/267,993

(22) Filed: Sep. 16, 2016

(65) Prior Publication Data

US 2017/0004976 A1     Jan. 5, 2017

Related U.S. Application Data

(63) Continuation of application No. 15/005,097, filed on Jan. 25, 2016, now Pat. No. 9,666,445.

(30) Foreign Application Priority Data

Mar. 20, 2015    (JP) ................................. 2015-058031

(51) Int. Cl.
    *H01L 21/311*      (2006.01)
    *H01L 21/768*      (2006.01)

(52) U.S. Cl.
CPC .. *H01L 21/31116* (2013.01); *H01L 21/76802* (2013.01); *H01L 21/76825* (2013.01); *H01L 21/76826* (2013.01); *H01L 21/76829* (2013.01)

(58) Field of Classification Search
CPC ........... H01L 21/3116; H01L 21/76826; H01L 21/76825; H01L 21/76829; H01L 21/76802
USPC ........................................................ 438/702
See application file for complete search history.

(56) References Cited

U.S. PATENT DOCUMENTS

| | | |
|---|---|---|
| 2003/0087196 A1 | 5/2003 | Tsujita et al. |
| 2005/0266691 A1 | 12/2005 | Gu et al. |
| 2013/0105728 A1 | 5/2013 | Umezaki et al. |
| 2014/0302683 A1 | 10/2014 | Kikuchi et al. |
| 2014/0349488 A1 | 11/2014 | Takada et al. |
| 2016/0049526 A1 | 2/2016 | Oganesian et al. |
| 2016/0087040 A1 | 3/2016 | Mao |
| 2016/0093537 A1 | 3/2016 | Chen et al. |

FOREIGN PATENT DOCUMENTS

| | | |
|---|---|---|
| JP | 2011-119310 A | 6/2011 |
| JP | 2001-274141 A | 10/2011 |
| JP | 2013-30531 A | 2/2013 |

OTHER PUBLICATIONS

European Search Report dated Jul. 25, 2016, in European Patent Application No. EP16150400.6.

*Primary Examiner* — David S Blum
(74) *Attorney, Agent, or Firm* — Shapiro, Gabor and Rosenberger, PLLC

(57) ABSTRACT

In order to provide a semiconductor device with high reliability while manufacturing cost is being suppressed, dry etching for an insulating film is performed by using mixed gas containing at least $CF_4$ gas and $C_3H_2F_4$ gas as its components.

9 Claims, 13 Drawing Sheets

$CF_4$ / $C_3H_2F_4$ / $O_2$ PROCESS

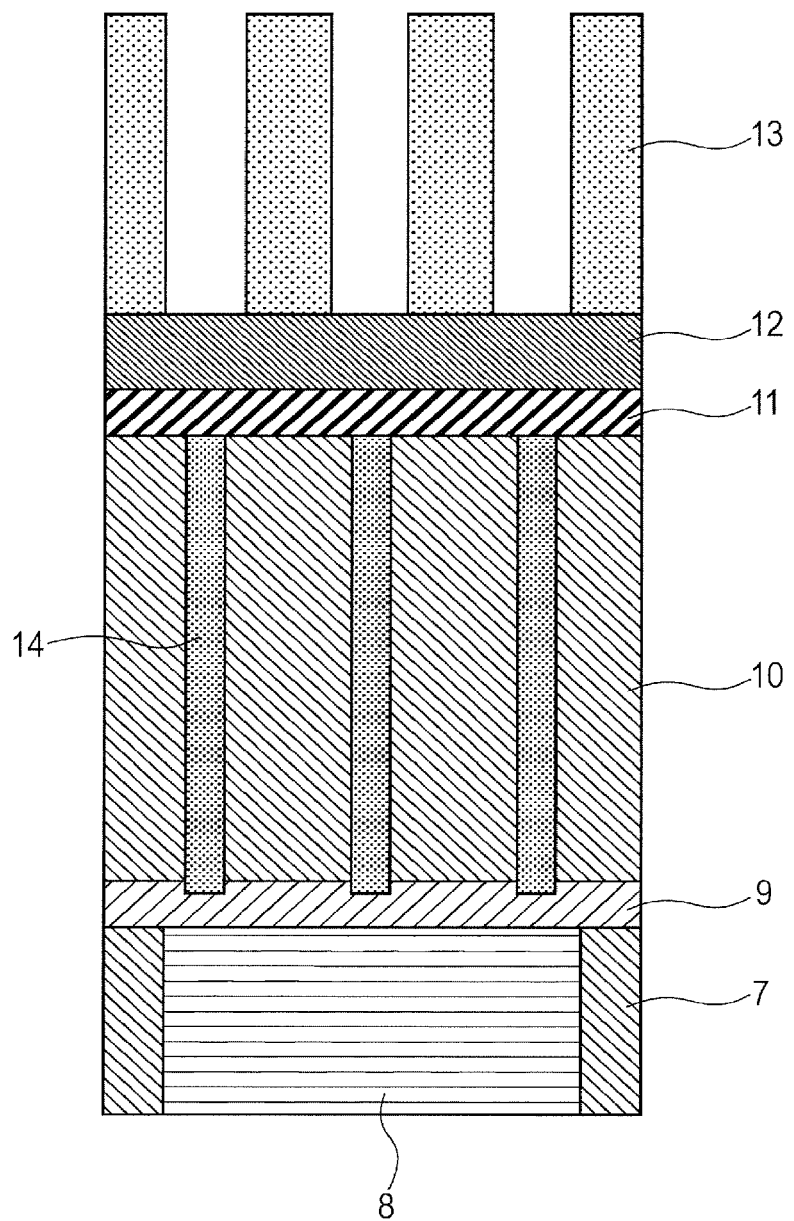

CF4 / C3H2F4 / O2 PROCESS

MANUFACTURING METHOD OF SEMICONDUCTOR DEVICE

CROSS-REFERENCE TO RELATED APPLICATIONS

The disclosure of Japanese Patent Application No. 2015-058031 filed on Mar. 20, 2015 including the specification, drawings and abstract is incorporated herein by reference in its entirety.

BACKGROUND

The present invention relates to a manufacturing method of a semiconductor device, and in particular, to a method of dry etching an insulating film.

In manufacturing processes of semiconductor devices, such as advanced microcomputer products, advanced SOC (System-on-a-Chip) products, and sophisticated liquid crystal drivers, ArF photolithography by an ArF excimer laser and a damascene process in which a wiring layer is embedded and formed in an insulating layer are used.

When a wiring layer is formed in a damascene process, a wiring trench (trench) is formed by dry etching an insulating layer, such as a silicon oxide film or a low dielectric constant film (Low-k film), with the use of an ArF resist as a mask.

Mixed gas, such as $CF_4/CHF_3$, $CF_4/CH_2F_2/N_2$, $CF_4/C_4F_6$, or $CF_4/C_4F_8$, is used as etching gas in the dry etching.

For example, a capacitively-coupled oxide film dry etching apparatus by two high-frequency waves is used as the dry etching apparatus. As these high-frequency waves, it is typical to apply a wave of 60 MHz frequency to the upper electrode and a wave of 2 MHz frequency to the lower electrode.

For example, the technique disclosed in Patent Document 1 (Japanese Unexamined Patent Application Publication No. 2001-274141) is cited as a background technique for the present technical field. Patent Document 1 discloses a manufacturing method of a semiconductor device, in which an insulating film including a silicon-based material is etched by mixed gas of $CHF_3/CO/CF_4$.

Patent Document 2 (Japanese Unexamined Patent Application Publication No. 2011-119310) discloses a method of etching a thin film including a semiconductor, a dielectric, or a metal by using etching gas containing $CHF_2COF$.

Patent Document 3 discloses an etching agent containing $C_aF_bH_c$. Herein, it is specified that: each of a, b, and c in the $C_aF_bH_c$ represents a positive integer (excluding a=3, b=4, c=2); and the relationships of $2 \leq a \leq 5$, $c < b \geq 1$, $2a+2 > b+c$, and $b \leq a+c$ are satisfied.

PRIOR ART DOCUMENT

Patent Document

[Patent Document 1] Japanese Unexamined Patent Application Publication No. 2001-274141
[Patent Document 2] Japanese Unexamined Patent Application Publication No. 2011-119310
[Patent Document 3] Japanese Unexamined Patent Application Publication No. 2013-30531

SUMMARY

When an insulating film, such as a silicon oxide film or a low dielectric constant film (Low-k film), is dry etched by using an ArF resist as a mask, as described above, the limit of a resist selection ratio, i.e., the limit of a ratio of the etch rate of the silicon oxide film to that of the resist mask during the etching is approximately 1.5.

It is meant that the performance of an etching mask is higher as the resist selection ratio is larger.

For example, when an ArF resist is used as an etching mask in a 90-nm process, the limit of the thickness of a silicon oxide film that can be precisely etched is approximately 200 nm in view of the thickness of the ArF resist.

So, in order to improve a resist selection ratio, a change is made in the hard specification of a dry etching apparatus, in which, for example, the RF frequency of a lower high-frequency power supply (RF power supply) is changed from 2 MHz to 27 MHz. It becomes possible to reduce a sputtering effect of an ion by increasing the RF frequency, thereby improving the resist selection ratio. With the change in the hard specification, the resist selection ratio is improved from approximately 1.5 to approximately 2.0, and the thickness of a silicon oxide film that can be etched becomes approximately 260 nm.

Alternatively, another method of improving a resist selection ratio can be adopted, in which a resist is caused to have a multilayer resist structure including an ArF resist.

However, each of a change in the hard specification of a dry etching apparatus and introduction of a multilayer resist leads to a significant increase in the manufacturing cost of a semiconductor device.

That is, a challenge in the present embodiment is to suppress manufacturing cost. Another challenge is to manufacture a semiconductor device with high reliability. Other challenges and new characteristics will become clear from the description and accompanying drawings of the present specification.

According to one embodiment, a manufacturing method of a semiconductor device is provided, in which an insulating film is dry etched by using mixed gas containing at least $CF_4$ gas and $C_3H_2F_4$ gas as its components.

Advantage of the Invention

According to the one embodiment, a semiconductor device with high reliability can be manufactured while the manufacturing cost thereof is being suppressed.

BRIEF DESCRIPTION OF THE DRAWINGS

FIG. 3A is a partial sectional view illustrating part of a manufacturing step of a semiconductor device according to one embodiment of the invention;

DETAILED DESCRIPTION

Figure 1A:
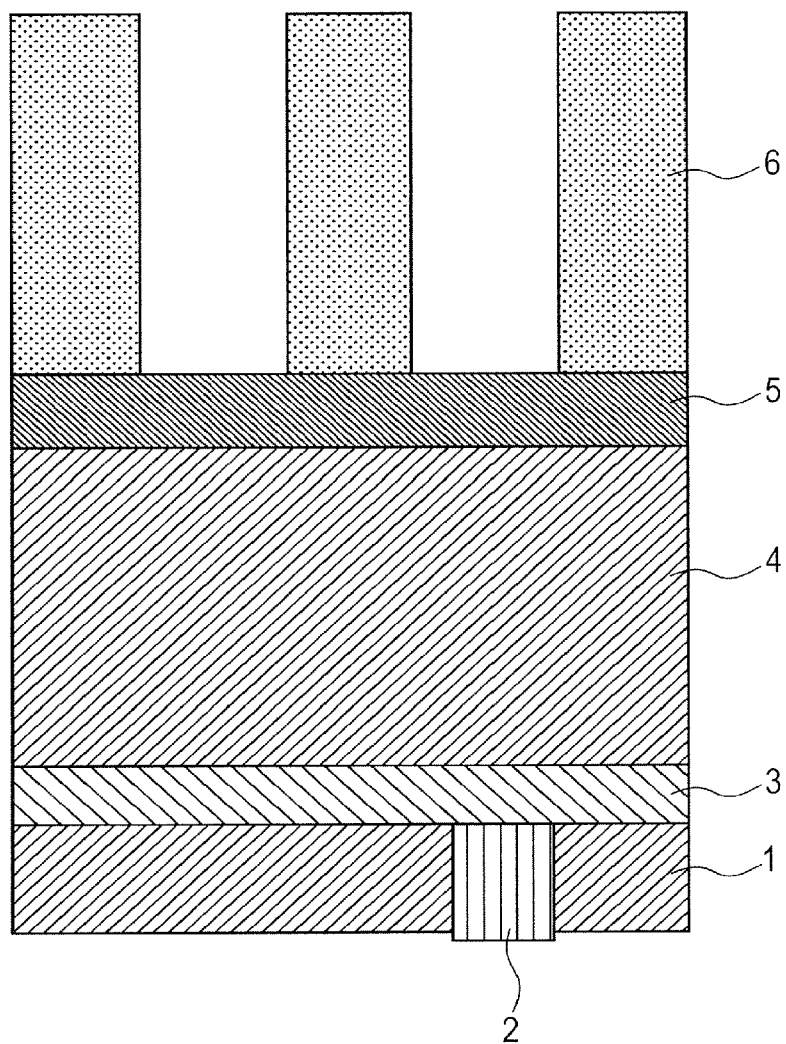
FIG. 1A is a partial sectional view illustrating part of a manufacturing step of a semiconductor device according to one embodiment of the present invention.

Hereinafter, examples, in each of which an insulating film is subjected to an etching process, will be described with reference to the views. In each view, members having the same configuration as each other are denoted with the same reference numeral, and detailed description of overlapping portions will be omitted.

FIRST EXAMPLE

Figure 1B:
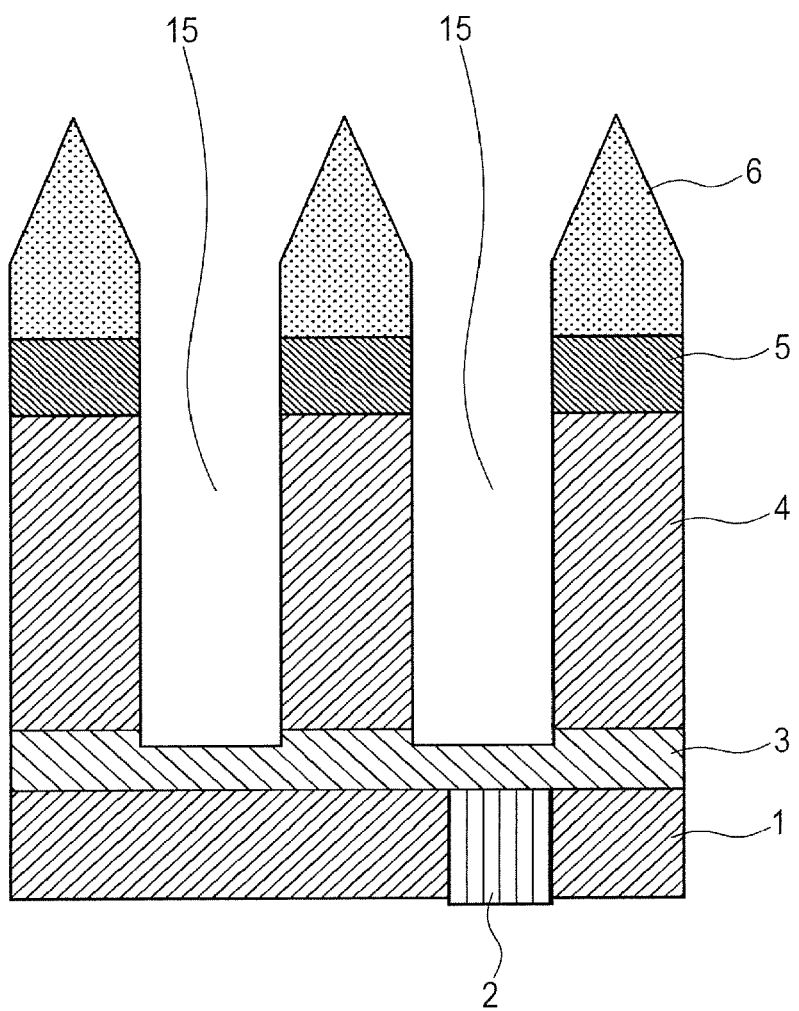
FIG. 1B is a partial sectional view illustrating part of a manufacturing step of a semiconductor device according to one embodiment of the invention.

A method of processing a trench (wiring trench) in a single damascene process will be described as an example in which an insulating film is subjected to an etching process, with reference to FIGS. 1A and 1B. FIG. 1A illustrates a state before a silicon oxide film formed over the surface of a semiconductor wafer is subjected to an etching process, while FIG. 1B illustrates a state after the silicon oxide film is subjected to the etching process.

As illustrated in FIG. 1A, a silicon oxide film 4 is formed over the surface (main surface) of a semiconductor wafer before being subjected to an etching process, and a BARC (Bottom-Anti-Reflection-Coating) film 5, which will serve as an antireflection film during exposure, is formed to cover the silicon oxide film 4.

A resist film 6, in which a predetermined pattern is formed by photolithography, is formed over the BARC film 5. The resist film 6 is an ArF resist to be exposed with ArF exposure by an ArF laser. A wiring pattern or a circuit pattern of a semiconductor device is transferred to the resist film 6 by photolithography using an ArF exposure apparatus.

A silicon nitride film (SiN film) 3, which will serve as an etching stopper film when a trench (wiring trench) is processed, is formed below the silicon oxide film 4. A silicon oxide film 1 is formed further below the SiN film 3, and a tungsten (W) plug 2 and non-illustrated lower layer wiring are formed in part of the silicon oxide film 1.

Figure 5:
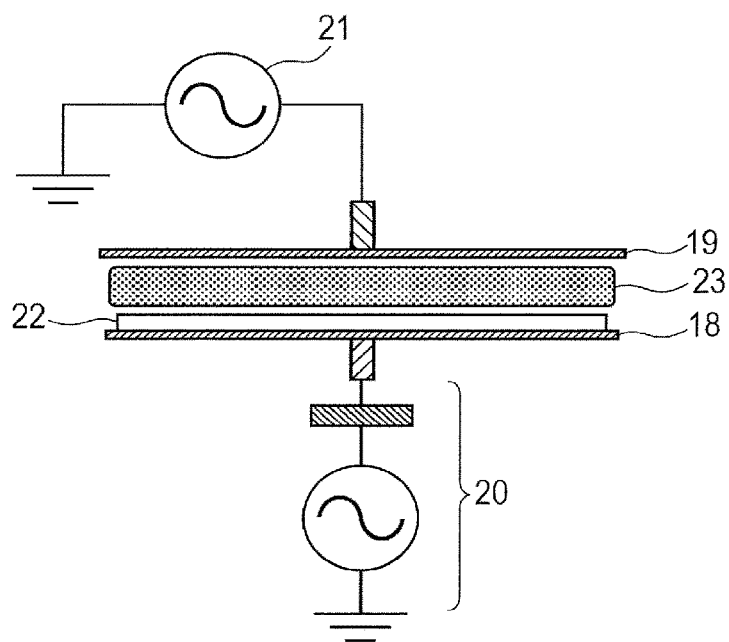
FIG. 5 is a view illustrating the outline of a dry etching apparatus.

A trench (wiring trench) 15 is formed in the silicon oxide film 4, as illustrated in FIG. 1B, by subjecting the laminated film structure illustrated in FIG. 1A to an etching process with the use of a dry etching apparatus as illustrated in FIG. 5. Embedded copper (Cu) wiring is formed in the trench (wiring trench) 15 after a Cu plating step and a CMP (Chemical-Mechanical-Polishing) step are performed later (Step j and Step k of FIG. 7). The dry etching apparatus illustrated in FIG. 5 is a dry etching apparatus of a two-frequency wave capacitively-coupled parallel plate type. A lower electrode 18 functions as a wafer stage, so that a semiconductor wafer 22 is mounted thereover. An upper electrode 19 is arranged to be spaced apart from the lower electrode 18 by a predetermined distance and to be parallel thereto.

A high-frequency power supply A20 is electrically coupled to the lower electrode 18 such that 2-MHz high-frequency power is applied to the lower electrode 18.

Also, a high-frequency power supply B21 is electrically coupled to the upper electrode 19 such that 60-MHz high-frequency power is applied to the upper electrode 19.

The lower electrode 18, the semiconductor wafer 22, and the upper electrode 19 are installed in a processing chamber in the dry etching apparatus. By vacuum exhausting the processing chamber, then by introducing etching gas between the lower electrode 18 and the upper electrode 19, and then by applying high-frequency power to each of the lower electrode 18 and the upper electrode 19, plasma 23 (plasma discharge) is generated between the lower electrode 18 and the upper electrode 19, thereby allowing a dry etching process to be performed.

When the trench (wiring trench) processing illustrated in FIGS. 1A and 1B is performed, the semiconductor wafer is subjected to a dry etching process by using the dry etching apparatus illustrated in FIG. 5. Dry etching conditions, under which the dry etching process is performed, are shown in Tables 1 and 2. Table 2 shows more suitable dry etching conditions to precisely perform the trench (wiring trench) processing.

TABLE 1

| Parameter | | Setting Range | Remarks |
|---|---|---|---|
| Upper RF Power (W) | | 200 to 2000 | 60 MHz |
| Lower RF Power (W) | | 200 to 2000 | 2 MHz |
| Process Pressure (Pa) | | 6.65 to 66.65 | (50 to 500 mTorr) |
| Etching Gas (sccm) | $CF_4$ | 50 to 500 | |
| | $C_3H_2F_4$ | 2 to 50 | |
| | $O_2$ | 2 to 100 | Addition of $O_2$ or $N_2$, if necessary |
| | $N_2$ | 20 to 300 | |
| | Ar | 50 to 500 | Addition as Career Gas, if necessary |
| Lower Electrode Temperature (° C.) | | −10 to +60 | |

TABLE 2

| Parameter | | Setting Range | Remarks |
|---|---|---|---|
| Upper RF Power (W) | | 500 | 60 MHz |
| Lower RF Power (W) | | 500 | 2 MHz |
| Process Pressure (Pa) | | 6.65 to 26.65 | (50 to 200 mTorr) |
| Etching Gas (sccm) | $CF_4$ | 100 to 250 | |
| | $C_3H_2F_4$ | 10 to 25 | |
| | $O_2$ | 10 to 50 | Addition of $O_2$ or $N_2$, if necessary |
| | $N_2$ | 10 to 100 | |
| | Ar | 100 to 250 | Addition as Career Gas, if necessary |
| Lower Electrode Temperature (° C.) | | +20 | |

In the dry etching of the present Example, mixed gas containing at least tetrafluoromethane ($CF_4$) and $C_3H_2F_4$ as its components is used, as shown in Tables 1 and 2.

Gas having a chain structure or a cyclic structure represented, for example, by any one of Chemical Formulae 1 to 8 is used as the $C_3H_2F_4$.

[Chemical Formula 1]

Chemical Formula 1 represents (E)-1,3,3,3-tetrafluoro-1-propene.

[Chemical Formula 2]

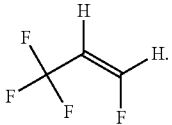

Chemical Formula 2 represents (Z)-1,3,3,3-tetrafluoropropene.

[Chemical Formula 3]

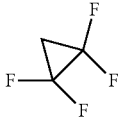

Chemical Formula 3 represents 1,1,2,2-tetrafluorocyclopropane.

[Chemical Formula 4]

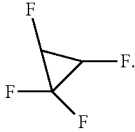

Chemical Formula 4 represents 1,1,2,3-tetrafluorocyclopropane.

[Chemical Formula 5]

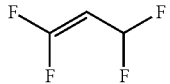

Chemical Formula 5 represents 1,1,3,3-tetrafluoro-1-propene.

[Chemical Formula 6]

Chemical Formula 6 represents 1,2,3,3-tetrafluoropropene.

[Chemical Formula 7]

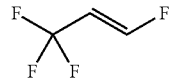

Chemical Formula 7 represents 1,3,3,3-tetrafluoro-1-propene.

[Chemical Formula 8]

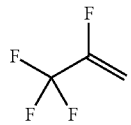

Chemical Formula 8 represents 2,3,3,3-tetrafluoropropene.

Herein, the $C_3H_2F_4$ may contain three carbon atoms (C), two hydrogen atoms (H), and four fluorine atoms (F), and $C_3H_2F_4$, in which: hydrogen atoms and fluorine atoms are bonded to carbon atoms by α bonding or β bonding; or hydrogen atoms and fluorine atoms are radically added, can also be used.

When $C_3H_2F_4$ having any one of the aforementioned structures is used as the etching gas, the degree of disassociation of its molecule in plasma is different from those of $(C_3H_2F_4)$s respectively having the other structures, depending on the presence or absence of a chain structure, a cyclic structure, or a double bond between carbon atoms; and hence it is preferable to select and use $C_3H_2F_4$ by which a desired etching shape can be obtained.

In the single damascene process, when the trench (wiring trench) 15 is formed in an interlayer insulating film, such as the silicon oxide film 4, by dry etching, as illustrated in FIGS. 1A and 1B, a resist selection ratio can be improved by using the mixed gas of $CF_4$ and $C_3H_2F_4$ as the etching gas. Thereby, the silicon oxide film 4 can be dry etched until the trench (wiring trench) 15 reaches the SiN film 3 serving as an etching stopper film, before the resist 6 completely disappears by being etched.

Herein, the BARC film 5 formed over the silicon oxide film 4 is also etched under the dry etching conditions shown in Table 1 or 2; however, the BARC film 5 may be dry etched under another dry etching conditions. It is also possible that: the BARC film 5 is etched by related art mixed gas, such as, for example, $CF_4/CHF_3$, $CF_4/CH_2F_2/N_2$, $CF_4/C_4F_6$, or $CF_4/C_4F_8$; and subsequently the lower silicon oxide film 4 is etched by the mixed gas of $CF_4$ and $C_3H_2F_4$.

Herein, a reason, why a high resist selection ratio can be obtained by using the mixed gas of $CF_4$ and $C_3H_2F_4$ for dry etching to achieve a high aspect ratio as in forming a trench (wiring trench) in a single damascene process, will be described with reference to FIGS. 4A and 4B.

Figure 4A:
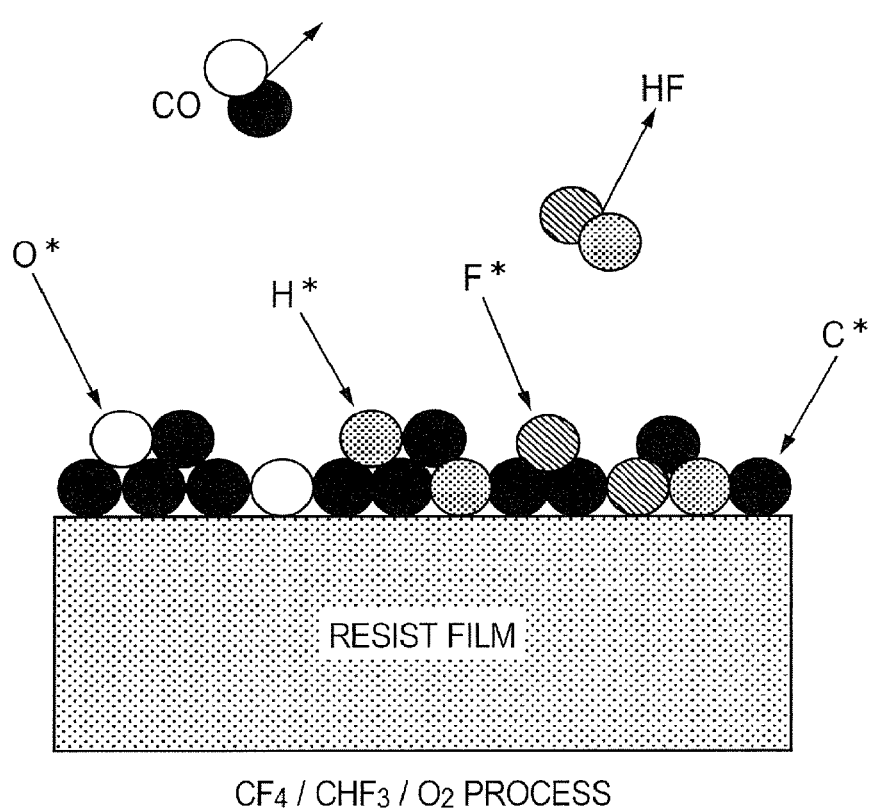
FIG. 4A is a view conceptually illustrating a reaction over a resist surface during dry etching.
Figure 4B:
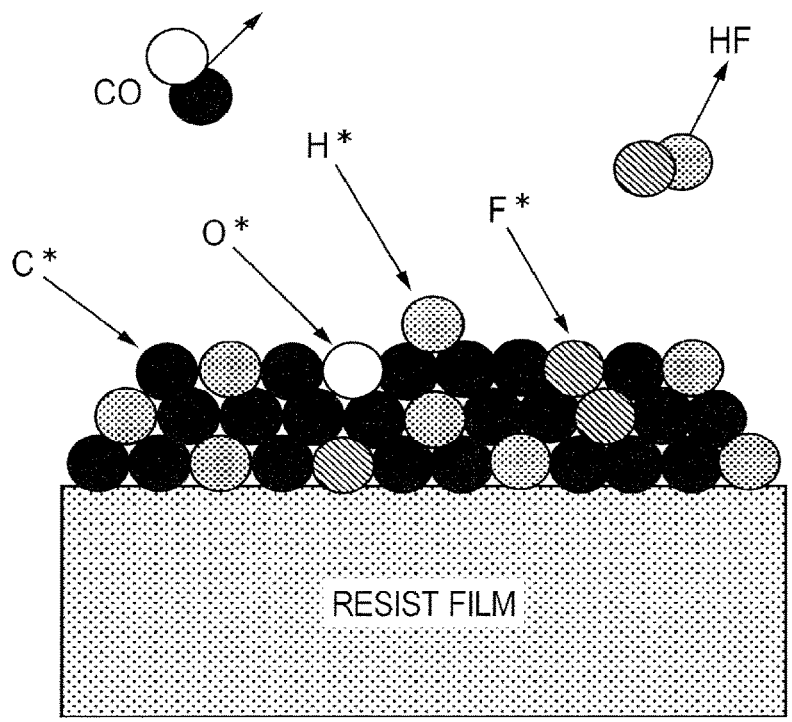
FIG. 4B is a view conceptually illustrating a reaction over a resist surface during dry etching.

FIGS. 4A and 4B are views each conceptually illustrating a reaction over a resist surface during dry etching. FIG. 4A illustrates a state during dry etching using related art $CF_4/CHF_3/O_2$ mixed gas, while FIG. 4B illustrates a state during dry etching using $CF_4/C_3H_2F_4/O_2$ mixed gas. The "*" in the views indicates a radical, i.e., a state of an atom or a molecule having an unpaired electron.

Each gas molecule that forms etching gas dissociates in plasma to produce an ion and a radical. Part of the radicals in plasma are combined with each other to produce carbon monoxide (CO), hydrogen fluoride (HF), and the like, which are vacuum exhausted.

Additionally, part of the radicals adhere to the surface of a resist film, so that a polymer (deposited film) is formed. The polymer (deposited film) functions as a protective film by which the resist film is protected from the sputtering of the resist film by the ions produced in the plasma and from a chemical reaction between the radicals and the resist surface.

As illustrated in FIG. 4B, when $CF_4/C_3H_2F_4$ mixed gas is used for dry etching, a polymer (deposited film) is formed over the surface of the resist film so as to have a thickness larger than that in the case where dry etching is performed under the related art conditions illustrated in FIG. 4A. It is because the number of the carbon (C) atoms and the hydrogen (H) atoms supplied into the plasma is increased by using $C_3H_2F_4$ for the etching gas. As a result, the etching resistance of the resist film is enhanced, thereby allowing a resist selection ratio to be improved. That is, the etching speed (etching rate) for a film to be processed, such as a silicon oxide film, can be improved relative to that for the resist film.

Because the $CF_4/C_3H_2F_4$ mixed gas to be used for the dry etching is main etching gas in which $CF_4$ gas mainly contributes to the etching of the silicon oxide film, the flow rate of the $CF_4/C_3H_2F_4$ mixed gas should satisfy the relationship of $CF_4>C_3H_2F_4$. Because $C_3H_2F_4$ gas contributes to the formation of a polymer (deposited film) as described above, if the flow rate of $C_3H_2F_4$ is larger than that of $CF_4$, there is the fear that the etching of the silicon oxide film may be impeded due to too much formation of a polymer (deposited film). There is the fear that the etching of the silicon oxide film may be stopped (etch stopped), for example, in the middle of the etching of a trench (wiring trench).

Also, argon (Ar) gas can be added as diluent gas (career gas), if necessary, as shown in Tables 1 and 2. With the addition of Ar gas, a resist selection ratio can be improved by $C_3H_2F_4$ gas, and an effect of ion-assisted etching at the bottom of a trench (wiring trench) can be obtained by the production of an Ar ion in the plasma.

Additionally, oxygen ($O_2$) gas or nitrogen gas ($N_2$) may be added, if necessary. The shape of a trench (wiring trench) formed by dry etching can be adjusted with the addition of $O_2$ gas or $N_2$ gas. When $O_2$ is added, it is more preferable to cause the flow rate of $CF_4/C_3H_2F_4/O_2$ mixed gas to satisfy the relationship of $CF_4>O_2>C_3H_2F_4$. When $N_2$ is added, it is more preferable to cause the flow rate of $CF_4/C_3H_2F_4/N_2$ mixed gas to satisfy the relationship of $CF_4>N_2>C_3H_2F_4$. It is because, in either case of adding $O_2$ or $N_2$, the control of the shape of a trench (wiring trench) by the addition of $O_2$ or $N_2$ becomes difficult if the flow rate of $C_3H_2F_4$ is too large. That is, it is preferable to cause the flow rate of $C_3H_2F_4$ gas to be: within the range shown in Tables 1 and 2 and smaller than those of $CF_4$ gas and Ar gas; and almost the same as or smaller than those of $O_2$ gas and $N_2$ gas.

When an insulating film, such as the silicon oxide film 4, is etched as illustrated in FIGS. 1A and 1B, it is particularly preferable to add $O_2$ gas. Additionally, when an organic insulating film, such as a carbon-added silicon oxide film (SiOC film) having a dielectric constant lower than that of the silicon oxide film 4, is used, it is preferable to use $CF_4/C_3H_2F_4/N_2$ mixed gas for etching gas, which can prevent the side etch shape of the organic insulating film from being formed.

According to the manufacturing method of a semiconductor device in the present example, a resist selection ratio can be improved when a trench (wiring trench) is formed in an interlayer insulating film by dry etching in a single damascene process, as described above, thereby allowing the trench (wiring trench) to be processed more precisely. Herein, without being limited to the formation of a trench (wiring trench) by a single damascene process, the present embodiment can be applied to opening of a contact hole that couples the semiconductor substrate and wiring or couples respective wiring, etc., and is also effective in simply subjecting an insulating film to an etching process.

In the evaluation performed by the present inventors, a resist selection ratio was able to be improved, for example, from related art 1.5 to 3.15. As a result, when ArF resists having the same thickness as each other were used, the thickness of a silicon oxide film that was able to be precisely processed was dramatically increased to approximately 420 nm, while the related art thickness thereof was approximately 200 nm.

Thereby, it becomes unnecessary to change the hard specification of a dry etching apparatus, such as a change in a lower high-frequency (RF) power supply (change from 2 MHz to 27 MHz), and to introduce a multilayer resist, which leads to a drastic reduction in manufacturing cost.

SECOND EXAMPLE

Figure 2A:
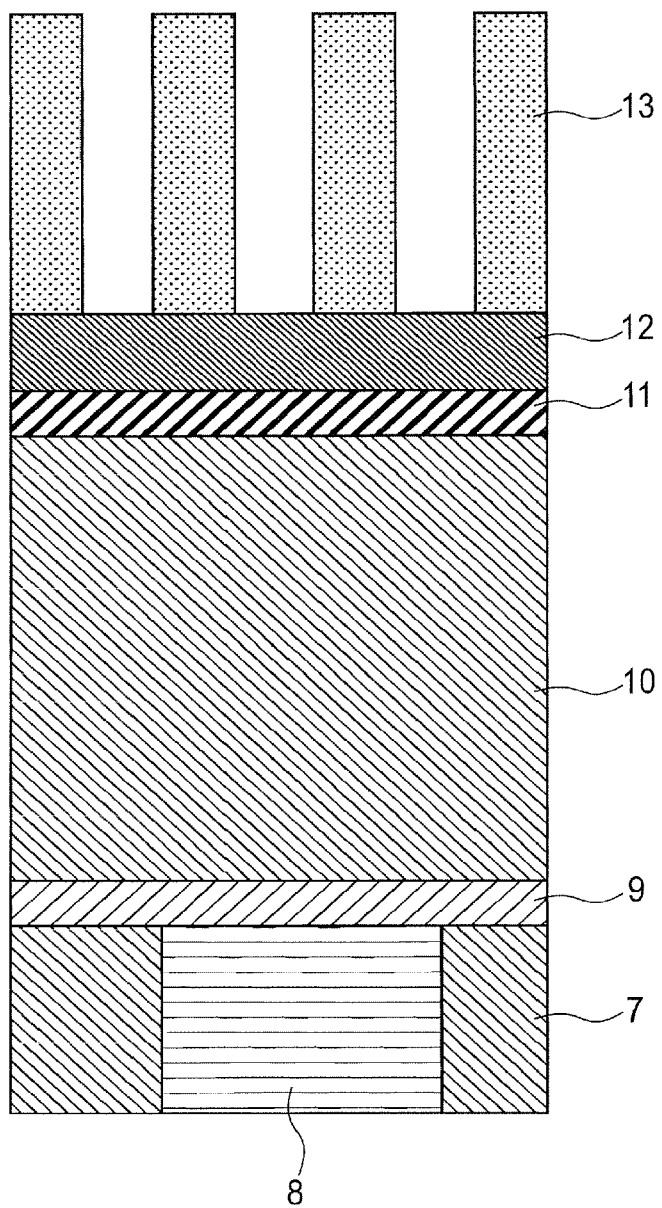
FIG. 2A is a partial sectional view illustrating part of a manufacturing step of a semiconductor device according to one embodiment of the invention.
Figure 2B:
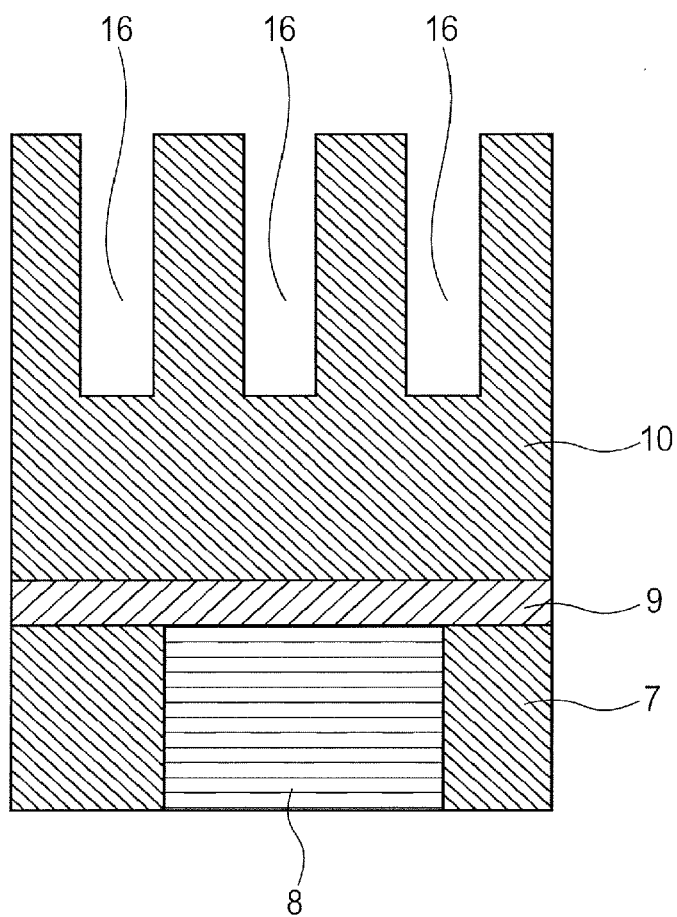
FIG. 2B is a partial sectional view illustrating part of a manufacturing step of a semiconductor device according to one embodiment of the invention.

A method of processing a trench (wiring trench) in a dual damascene process will be described as an example in which an insulating film is subjected to an etching process, with reference to FIGS. 2A and 2B. FIG. 2A illustrates a state of a carbon-added silicon oxide film (SiOC film) formed over the surface of a semiconductor wafer before being subjected to an etching process; while FIG. 2B illustrates a state thereof after being subjected to the etching process.

As illustrated in FIG. 2A, a carbon-added silicon oxide film (SiOC film) 10 is formed over the surface (main surface) of a semiconductor wafer before being subjected to an etching process, and a cap film (TEOS film) 11 is formed to cover the carbon-added silicon oxide film (SiOC film) 10. The carbon-added silicon oxide film (SiOC film) 10 is a low dielectric constant film referred to as a Low-k film. A BARC (Bottom-Anti-Reflection-Coating) film 12, which will serve as an antireflection film during exposure, is formed over the cap film (TEOS film) 11.

A resist film 13, in which a predetermined pattern is formed by photolithography, is formed over the BARC film 12. The resist film 13 is an ArF resist to be exposed by ArF exposure by an ArF laser. A wiring pattern or a circuit pattern of a semiconductor device is transferred to the resist film 13 by photolithography using an ArF exposure apparatus.

A barrier film 9 is formed below the carbon-added silicon oxide film (SiOC film) 10. A laminated film, such as, for example, a SiCO film/SiCN film, is used for the barrier film 9. The barrier film 9 functions as a diffusion prevention film (barrier film) for Cu wiring 8 formed in a carbon-added silicon oxide film (SiOC film) 7 formed further below, and functions as an etching stopper film when a via hole (contact hole) is formed in the carbon-added silicon oxide film (SiOC film) 10.

By subjecting the laminated film structure illustrated in FIG. 2A to an etching process with the use of the dry etching apparatus illustrated in FIG. 5, similarly to First Example, a trench (wiring trench) 16 is formed in the carbon-added silicon oxide film (SiOC film) 10, as illustrated in FIG. 2B. FIG. 2B illustrates a state after the dry etching followed by the removal of the cap film (TEOS film) 11, the BARC film 12, and the resist film 13 with an ashing process, or the like. Embedded Cu wiring is formed in the trench (wiring trench) 16 after a Cu plating step and a CMP (Chemical-Mechanical-Polishing) step are performed later (Step j and Step k of FIG. 7). Subsequently, a dual damascene process in the present Example will be described in more detail with reference to FIGS. 3A to 3F. The dual damascene process illustrated in FIGS. 3A to 3F is a so-called via-first process in which a via hole (contact hole) is first formed in an interlayer insulating film and a trench (wiring trench) is then formed.

FIG. 3A illustrates a state where a via hole has already been formed. The via hole is formed by dry etching the carbon-added silicon oxide film (SiOC film) 10 with the use of $CF_4/C_3H_2F_4$ mixed gas. The conditions of the $CF_4/C_3H_2F_4$ mixed gas during the formation are the same as those under which the trench (wiring trench) 16 is formed. Although the via hole is a narrower and deeper trench than the trench (wiring trench) 16, even such a trench having a high aspect ratio can be etched well by performing the etching according to the present embodiment.

FIG. 3A illustrates a state before the trench (wiring trench) 16 is formed in the carbon-added silicon oxide film (SiOC film) 10. A barrier film 9 including a laminated film of a SiCO film/a SiCN film is formed over the lower carbon-added silicon oxide film (SiOC film) 7 and the Cu wiring 8. The barrier film 9 prevents Cu from diffusing into the upper layer. The upper carbon-added silicon oxide film (SiOC film) 10 is formed over the barrier film 9. A via fill 14 is formed in advance in the carbon-added silicon oxide film (SiOC film) 10. The via fill 14 is formed by forming a via hole in the carbon-added silicon oxide film (SiOC film) 10 with the use of dry etching and then by filling the via hole with a via-filling material. The barrier film 9 also functions as an etching stopper film while the via hole is being formed in the carbon-added silicon oxide film (SiOC film) 10.

The cap film (TEOS film) 11 is formed over the carbon-added silicon oxide film (SiOC film) 10, and the BARC film 12, which will serve as an antireflection film during exposure, is formed over the cap film (TEOS film) 11. The resist film 13, in which a predetermined pattern is formed by photolithography, is formed over the BARC film 12.

Figure 3B:
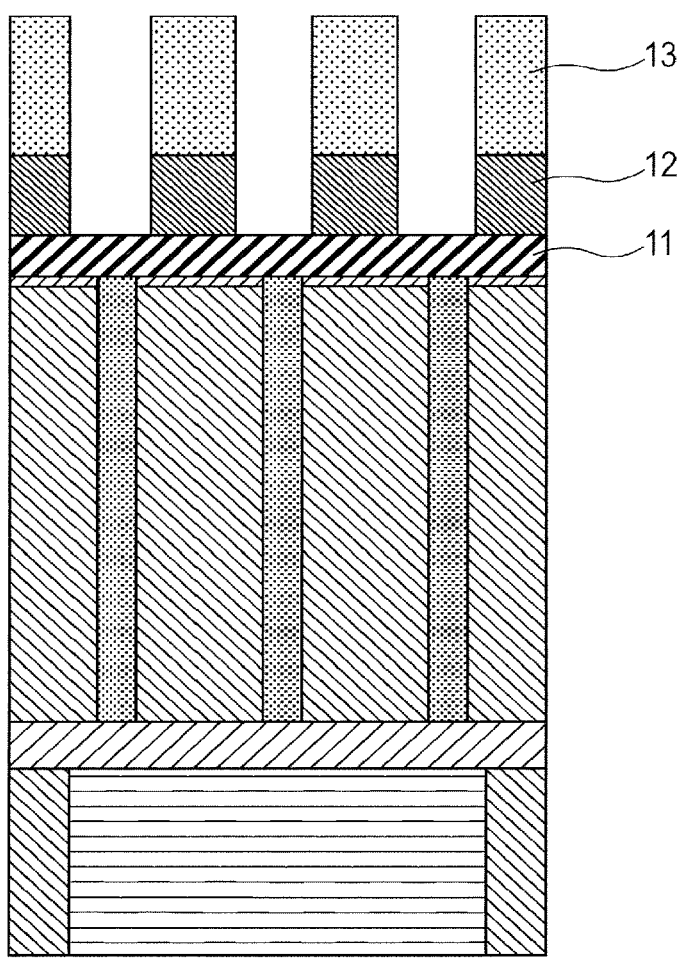
FIG. 3B is a partial sectional view illustrating part of a manufacturing step of a semiconductor device according to one embodiment of the invention.
Figure 3C:
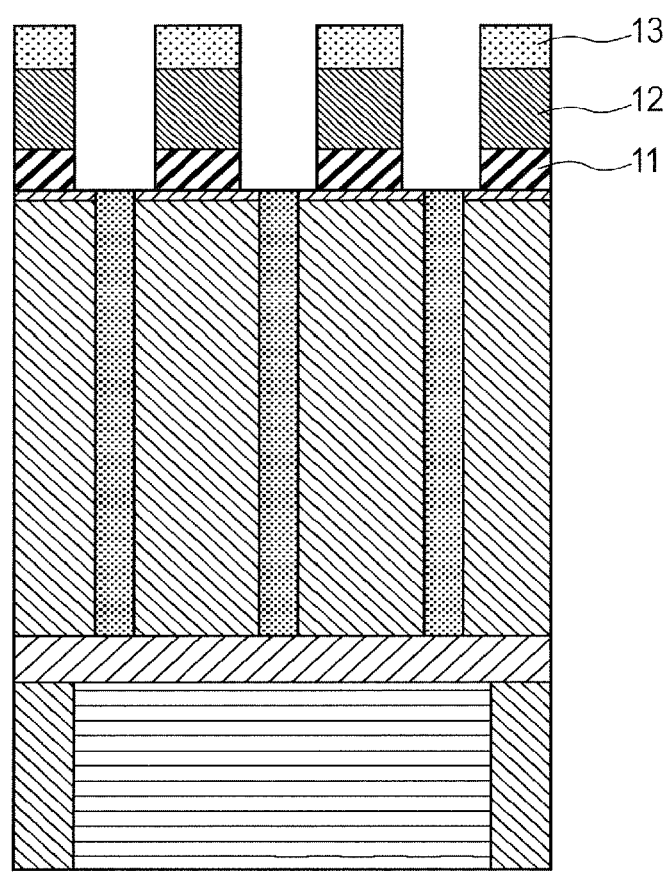
FIG. 3C is a partial sectional view illustrating part of a manufacturing step of a semiconductor device according to one embodiment of the invention.
Figure 3D:
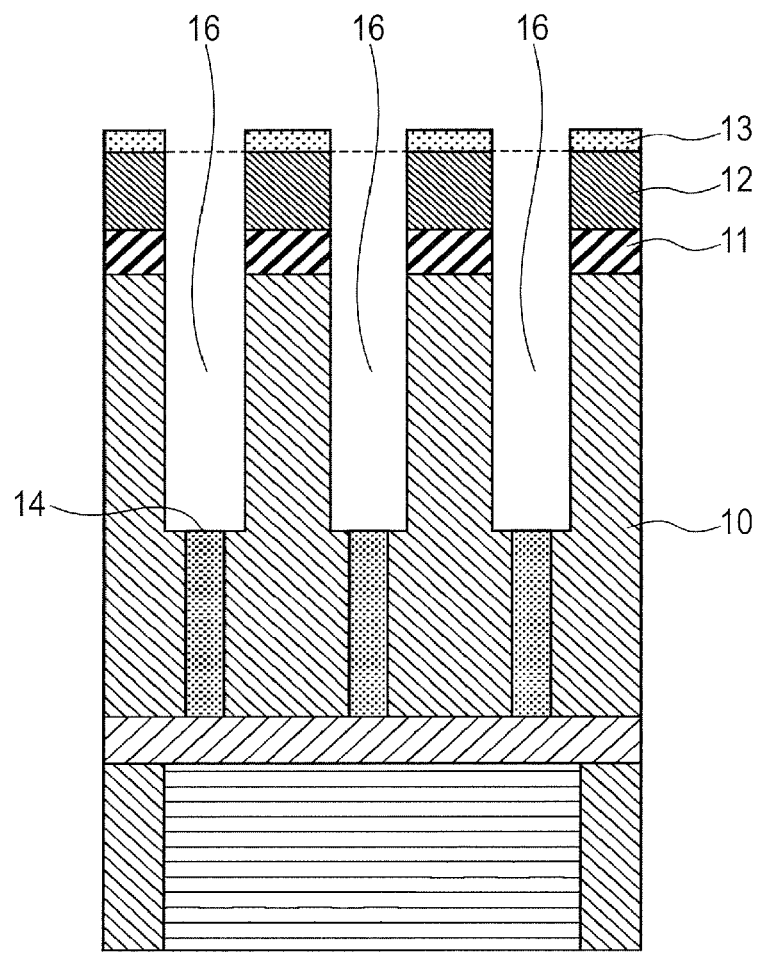
FIG. 3D is a partial sectional view illustrating part of a manufacturing step of a semiconductor device according to one embodiment of the invention.
Figure 3E:
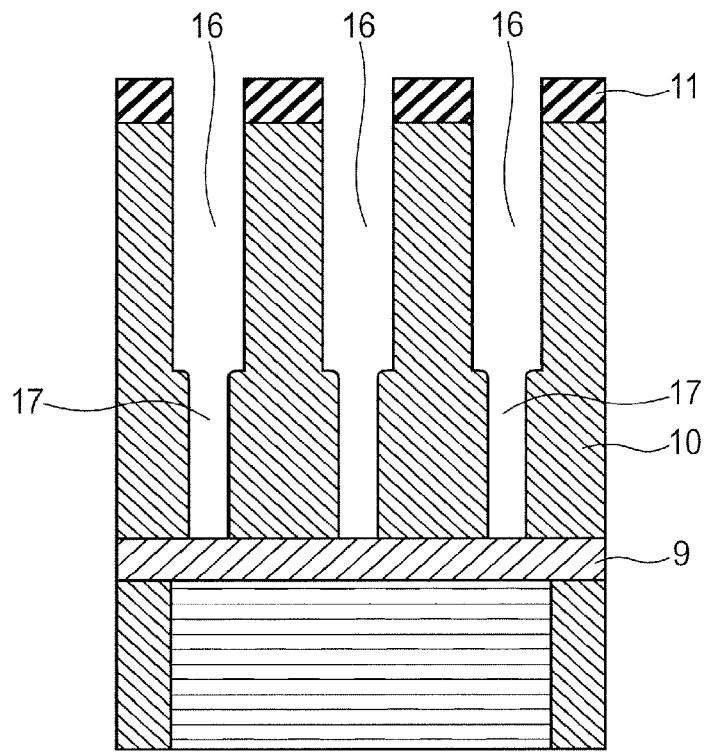
FIG. 3E is a partial sectional view illustrating part of a manufacturing step of a semiconductor device according to one embodiment of the invention.
Figure 3F:
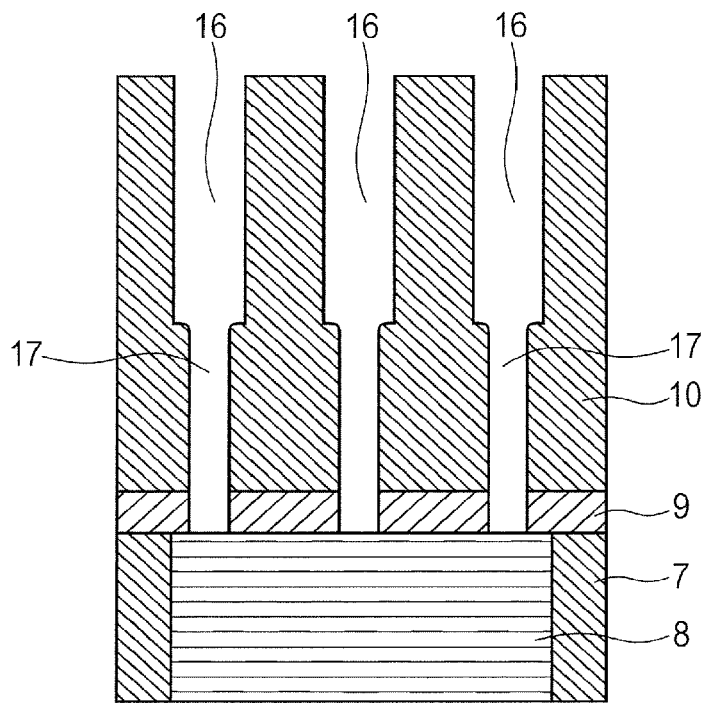
FIG. 3F is a partial sectional view illustrating part of a manufacturing step of a semiconductor device according to one embodiment of the invention.

The trench (wiring trench) 16 and the via hole 17 that are illustrated in FIG. 3F are formed by sequentially subjecting the laminated film structure illustrated in FIG. 3A to the steps illustrated in FIGS. 3B to 3F with the use of the dry etching apparatus as illustrated in FIG. 5.

The processing illustrated in FIGS. 3A through 3F are performed under the conditions shown in Table 3. The conditions of Step 1 in Table 3 are those under which the BARC film 12 is etched. The conditions of Step 2 therein are those under which the cap film 11 or the carbon-added silicon oxide film 10 is etched. The conditions of Step 3 therein are those under which an ashing process is performed. The conditions of Step 4 therein are those under which the barrier film 9 is etched.

TABLE 3

| Parameter | | Step 1 | Step 2 | Step 3 | Step 4 | Remarks |
|---|---|---|---|---|---|---|
| Upper RF Power (W) | | 200 to 2000 | 500 | 200 to 2000 | 200 to 2000 | 60 MHz |
| Lower RF Power (W) | | 200 to 2000 | 500 | 200 to 2000 | 200 to 2000 | 2 MHz |
| Process Pressure (Pa) | (Pa) | 3.99 to 26.65 | 6.65 to 26.65 | 6.65 to 66.5 | 3.99 to 26.65 | |
| | (mTorr) | 30 to 200 | 50 to 200 | 50 to 500 | 30 to 200 | |

TABLE 3-continued

| Parameter | | Step 1 | Step 2 | Step 3 | Step 4 | Remarks |
|---|---|---|---|---|---|---|
| Etching Gas (sccm) | $CF_4$ | 50 to 500 | 100 to 250 | — | 50 to 500 | |
| | $C_4F_8$ | 0 to 20 | — | — | — | |
| | $C_3H_2F_4$ | — | 10 to 25 | — | — | |
| | $O_2$ | 0 to 20 | 10 to 50 | 0 to 1000 | — | In Step 2, addition of $O_2$ or $N_2$, if necessary. |
| | $N_2$ | — | 10 to 100 | — | — | |
| | Ar | 0 to 1000 | 100 to 250 | — | 0 to 1000 | In Step 2, addition as Career Gas, if necessary. |

As illustrated in FIGS. 3A and 3B, the BARC film 12 is first dry etched by using the resist film 13 as a mask (Step 1 in Table 3). The $CF_4/C_4F_8$ mixed gas is used for the dry etching. At the time, the resist film 13 is also etched along with the BARC film 12, and hence the thickness of the resist film 13 is reduced.

Subsequently, the cap film (TEOS film) 11 is dry etched by using each of the resist film 13 and the patterned BARC film 12 as a mask, as illustrated in FIGS. 3B and 3C. For example, the $CF_4/C_3H_2F_4$ mixed gas or the $Ar/C_4F_8$ mixed gas that are shown in Step 2 in Table 3 is used for the dry etching. At the time, the resist film 13 is also etched along with the cap film (TEOS film) 11, and hence the thickness of the resist film 13 is further reduced.

Subsequently, the carbon-added silicon oxide film (SiOC film) 10 is dry etched by using each of the resist film 13, the patterned BARC film 12, and the patterned cap film (TEOS film) 11 as a mask, as illustrated in FIGS. 3C and 3D (Step 2 in Table 3). The $CF_4/C_3H_2F_4$ mixed gas is used for the dry etching. At the time, the resist film 13 is also etched along with the carbon-added silicon oxide film (SiOC film) 10, and hence the thickness of the resist film 13 is furthermore reduced.

The trench (wiring trench) 16 formed in the carbon-added silicon oxide film (SiOC film) 10 is a trench having a high aspect ratio, i.e., a narrow and deep trench, as illustrated FIG. 3D, and hence when a dry etching process is performed, dry etching having a high resist selection ratio and a small side etch amount should be performed.

By using $CF_4/C_3H_2F_4$ mixed gas for the dry etching between FIGS. 3C and 3D, a narrow and deep trench (wiring trench) can be formed in the carbon-added silicon oxide film (SiOC film) 10 while the etching of the resist film 13 is being suppressed, due to the mechanism described with reference to FIG. 4 in First Example.

Further, the carbon-added silicon oxide film (SiOC film) 10 can be etched while a polymer (deposited film) serving as a sidewall protective film is being formed in the sidewall of the trench during the dry etching, by using $CF_4/C_3H_2F_4$ mixed gas, and hence etching having a small side etch amount can be performed.

Herein, $O_2$ gas or $N_2$ gas may be added to the etching gas, if necessary, as shown in Step 2 in Table 3. However, when $O_2$ gas is added in etching an organic insulating film, such as the carbon-added silicon oxide film (SiOC film) 10, there is the fear that side etch may be created in the bottom of a trench. Accordingly, it is preferable to use $N_2$ gas as additive gas.

Alternatively, inactive gas, such as argon gas (Ar), can also be added as career gas. Advantages obtained by the addition of Ar gas are similar to those in First Example. Relationships among the flow rates of the respective gas in the mixed gas are also similar to those in First Example. That is, it is preferable to cause the flow rate of $C_3H_2F_4$ gas to be: within the range shown in Table 3 and smaller than those of $CF_4$ gas and Ar gas; and almost the same as or smaller than that of $N_2$ gas.

The trench (wiring trench) 16 having a more desired shape can be formed, for example, by adjusting the addition amounts of $O_2$ gas, $N_2$ gas, and Ar gas, while checking the shape of the trench (wiring trench) 16 illustrated in FIG. 3D with SEM observation, etc.

Thereafter, the resist film 13, the BARC film 12, and the via fill 14, which are left without being etched, are removed by an ashing process, as illustrated in FIGS. 3D and 3E (Step 3 in Table 3). The ashing process may be performed by changing gas in an etching processing chamber in the dry etching apparatus by which Steps 1 to 3 in Table 3 are performed, or may be performed in another processing chamber (not illustrated) coupled to the dry etching apparatus illustrated in FIG. 5.

Finally, by removing the barrier film 9 at the bottom of the via hole 17 with dry etching, the via hole 17, for forming a contact (via) with the trench (wiring trench) 16 and the lower Cu wiring 8 in the dual damascene process, is formed (Step 4 in Table 3), as illustrated in FIGS. 3E and 3F. According to the manufacturing method of a semiconductor device in the present Example, a resist selection ratio can be improved when a trench (wiring trench) is formed in an interlayer insulating film by dry etching in the dual damascene process, as described above, thereby allowing a trench (wiring trench) to be processed more precisely.

Thereby, it becomes unnecessary to change the hard specification of a dry etching apparatus, such as a change in a lower high-frequency (RF) power supply (change from 2 MHz to 27 MHz), and to introduce a multilayer resist, which leads to a drastic reduction in manufacturing cost.

An example has been illustrated in FIGS. 3A to 3F, in which a via hole is formed in advance in a carbon-added silicon oxide film (SiOC film) that is an interlayer insulating film and the via hole is filled with a via-filling material; and in the dry etching for forming the via hole, mixed gas, such as $CF_4/CHF_3$, $CF_4/CH_2F_2/N_2$, $CF_4/C_4F_6$, $CF_4/C_4F_8$, or $C_4F_8/Ar/N_2$, is used. Alternatively, $CF_4/C_3H_2F_4$ mixed gas may be used in place of these mixed gas.

By using $CF_4/C_3H_2F_4$ mixed gas, a narrow and deep via hole (contact hole) can be formed precisely, similarly to when a trench (wiring trench) is formed.

THIRD EXAMPLE

Figure 6:
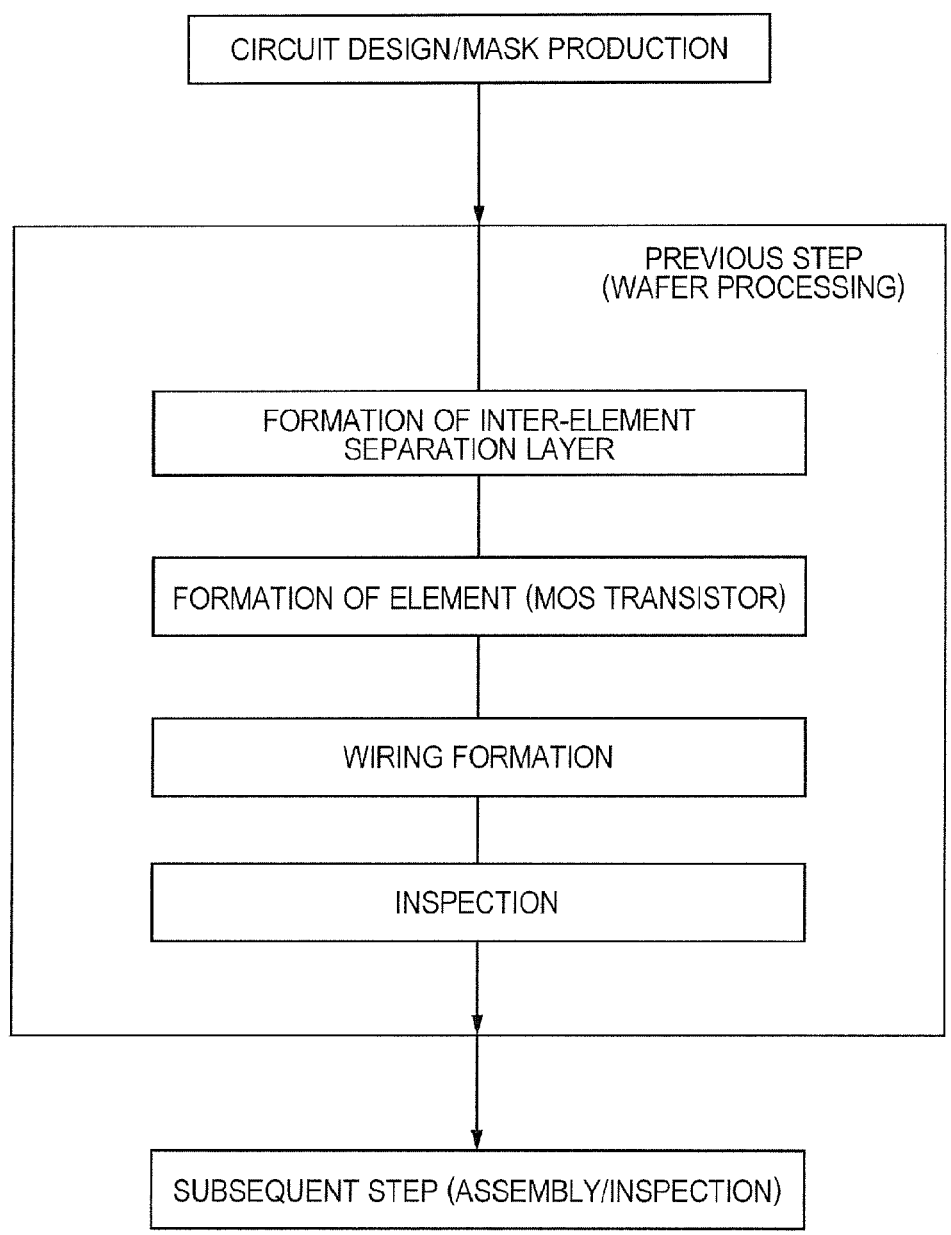
FIG. 6 is a flowchart illustrating the outline of a manufacturing process of a semiconductor device.
Figure 7:
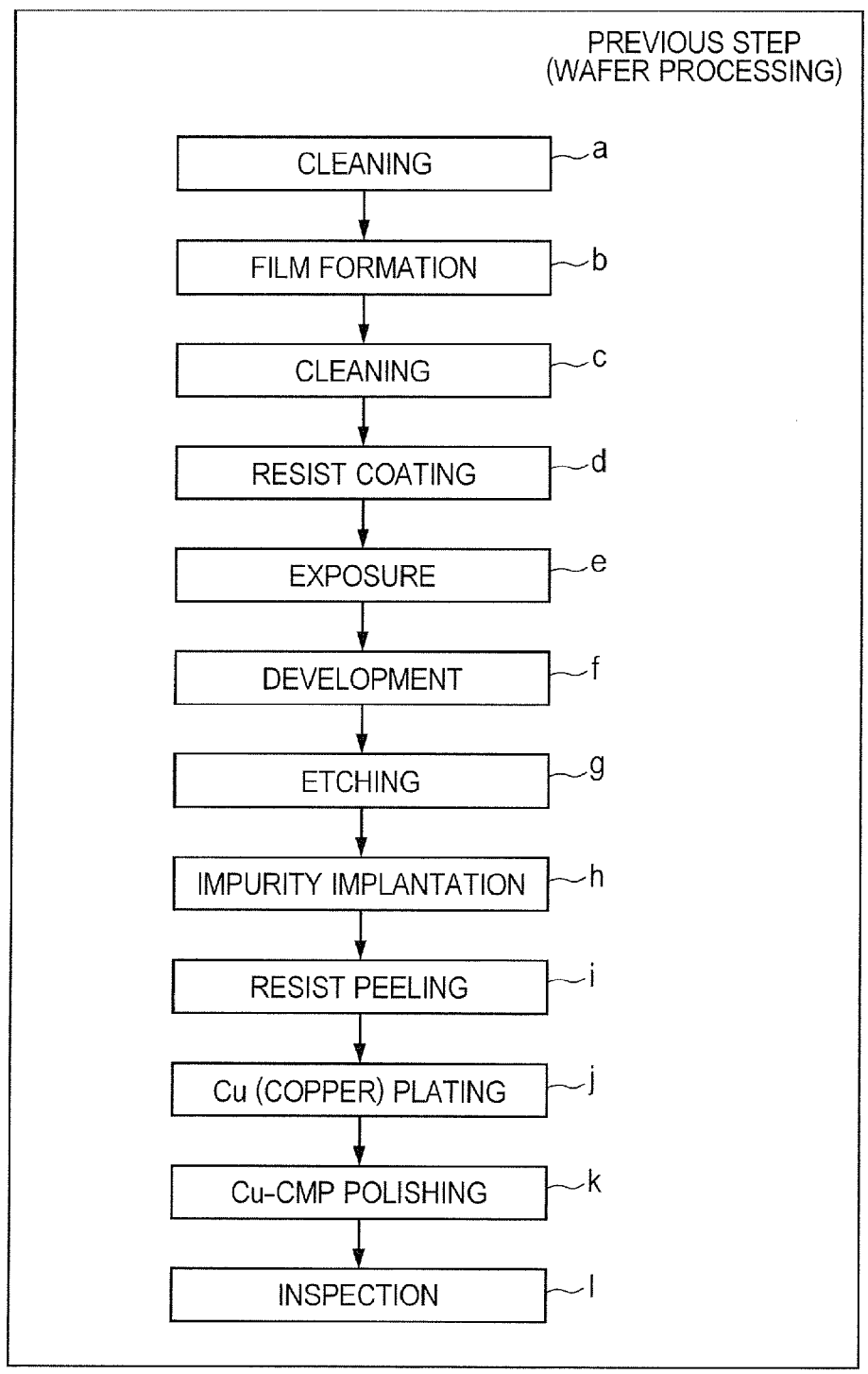
FIG. 7 is a flowchart illustrating the outline of a previous step in a manufacturing process of a semiconductor device.

A method of manufacturing a semiconductor device, such as an advanced microcomputer product, an advanced SOC product, or a sophisticated liquid crystal driver, by the process flow described in First Example or Second Example will be described with reference to FIGS. 6 and 7. FIG. 6 is a flowchart illustrating the outline of a manufacturing process of a semiconductor device. FIG. 7 is a flowchart illustrating the outline of a previous step in the manufacturing process of a semiconductor device.

The manufacturing process of a semiconductor device is roughly divided into three steps, as illustrated in FIG. 6.

A semiconductor circuit is first designed, and then a mask is produced based on the circuit design.

Subsequently, an integrated circuit is formed over the surface of a semiconductor substrate (wafer), such as silicon, by repeating various surface processing multiple times in a wafer processing step referred to as a previous step. As illustrated in FIG. 6, the previous step is roughly divided into: a step of forming an inter-element separation layer; a step of forming an element, such as a MOS transistor; a wiring formation step of forming wiring between respective elements and transistors; a step of inspecting a completed wafer; and the like.

Further, the wafer, over the surface of which integrated circuits are formed, is separated individually to be assembled as a semiconductor device that is then inspected, in a subsequent step.

In the previous step that is a wafer processing step, a plurality of surface processing steps from a to l illustrated in FIG. 7 are repeated multiple times.

The surface of a wafer that is a semiconductor substrate is first cleaned to remove foreign substances and impurities adhering thereto (Step a). Subsequently, a thin film is formed over the surface of the wafer by using a CVD apparatus, or the like. The thin film is: a film for forming both an interlayer insulating film, such as a silicon oxide film, and wiring, such as an aluminum film; or the like (Step b). After the thin film is formed over the surface of the wafer, foreign substances and impurities adhering to the surface are removed again by cleaning (Step c). A resist material including a photosensitive material, etc., is coated over the wafer, over the surface of which the film for forming both an interlayer insulating film and wiring is formed (Step d). By using a mask in which a desired circuit pattern is formed, the circuit pattern is transferred to the resist with an exposure apparatus (Step e). The resist remaining in an unnecessary portion is removed by a developing process, so that the desired circuit pattern is formed in the resist over the wafer (Step f). Unnecessary portions of the thin film formed over the wafer are removed by etching using a dry etching apparatus with the use of the resist in which the desired circuit pattern is formed as an etching mask, thereby allowing the desired circuit pattern to be formed in the thin film (Step g). Thereafter, impurities are implanted into the surface of the wafer by an ion implantation apparatus, if necessary (Step h). The resist formed over the wafer is peeled (removed) by an asking process or cleaning (Step i). When embedded Cu wiring is formed by the single damascene process or the dual damascene process, Cu is subsequently embedded in the trench (wiring trench) and the via hole that are formed in the thin film by the etching (step g), with a plating process (Step j). Excessive Cu formed over the surface of the wafer is removed by Cu-CMP polishing (Step k). Finally, it is inspected that no foreign substance is present over the wafer and the desired circuit pattern is precisely formed in the thin film, by a foreign substance inspection apparatus and a visual inspection apparatus (Step l). Processing, such as cleaning or drying of the wafer, is performed in any one of the aforementioned Steps a through l, if necessary.

In the manufacturing method of a semiconductor device in the present Example, the single damascene process or the dual damascene process described in Example 1 or Example 2 is applied to the aforementioned Step g such that embedded Cu wiring is formed. That is, a trench (wiring trench) or a via hole is formed by using, as etching gas, mixed gas containing $CF_4/C_3H_2F_4$ in the dry etching of Step g, and embedded Cu wiring is formed in the trench (wiring trench) and the via hole by performing the Cu plating process of Step j and the Cu-CMP polishing of Step k.

By applying the process flow described in Example 1 or Example 2 to the manufacturing process of a semiconductor device, such as an advanced microcomputer product or an advanced SOC product, as described above, a trench (wiring trench) or a via hole can be precisely formed, and hence the manufacturing yield and the process yield of a semiconductor device, such as an advanced microcomputer product and an advanced SOC product, can be improved.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A manufacturing method of a semiconductor device, comprising steps of:
   (a) forming a first insulating film over a semiconductor wafer;
   (b) forming a plug in the first insulating film;
   (c) forming an etching stopper film over the first insulating film and the plug;
   (d) forming a second insulating film over the etching stopper film;
   (e) forming a resist film over the second insulating film;
   (f) forming a trench in the second insulating film and the etching stopper film by using the resist film as a mask; and
   (g) forming a wiring in the trench,
   wherein the second insulating film includes at least silicon and oxygen,
   wherein the etching stopper film is formed of a different material from the second insulating film,
   wherein, in the step (f), the second insulating film is etched by a dry etching process using mixed gas containing at least $CF_4$ gas and $C_3H_2F_4$ gas as its components, and
   wherein a flow rate condition of the mixed gas to be used for the dry etching process of the step (f) satisfies a relationship of $CF_4 > C_3H_2F_4$.

2. A manufacturing method of a semiconductor device according to claim 1, wherein the second insulating film is a silicon oxide film, and
   wherein the mixed gas further contains $O_2$ gas.

3. A manufacturing method of a semiconductor device according to claim 2, wherein a flow rate of the mixed gas to be used for the step (f) satisfies a relationship of $CF_4 > O_2 > C_3H_2F_4$.

4. A manufacturing method of a semiconductor device according to claim 3, wherein the mixed gas further contains Ar gas.

5. A manufacturing method of a semiconductor device according to claim 1, wherein the second insulating film is a carbon-added silicon oxide film, and
   wherein the mixed gas further contains $N_2$ gas.

6. A manufacturing method of a semiconductor device according to claim 5, wherein a flow rate of the mixed gas to be used for the step (f) satisfies a relationship of $CF_4 > N_2 > C_3H_2F_4$.

7. A manufacturing method of a semiconductor device according to claim 6, wherein the mixed gas further contains Ar gas.

8. A manufacturing method of a semiconductor device according to claim 1, wherein the wiring includes copper.

9. A manufacturing method of a semiconductor device according to claim 1, wherein the etching stopper film includes at least silicon and nitrogen.

* * * * *